US012795954B2

(12) United States Patent
Lee et al.

(10) Patent No.: US 12,795,954 B2
(45) Date of Patent: Nov. 10, 2026

(54) MEMORY DEVICE AND A MEMORY SYSTEM INCLUDING THE MEMORY DEVICE

(71) Applicant: SAMSUNG ELECTRONICS CO., LTD., Suwon-si (KR)

(72) Inventors: Minwoo Lee, Suwon-si (KR); Byoungkon Jo, Suwon-si (KR); Duk Sung Kim, Suwon-si (KR); Joonho Jun, Suwon-si (KR); Doohee Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 234 days.

(21) Appl. No.: 18/736,967

(22) Filed: Jun. 7, 2024

(65) Prior Publication Data

US 2025/0120099 A1 Apr. 10, 2025

(30) Foreign Application Priority Data

Oct. 10, 2023 (KR) ........................ 10-2023-0134570

(51) Int. Cl.

| | |
|---|---|
| ***H10B 80/00*** | (2026.01) |
| ***G11C 5/06*** | (2006.01) |
| ***H10W 90/00*** | (2026.01) |
| ***H10W 90/20*** | (2026.01) |

(52) U.S. Cl.

CPC ............. *H10B 80/00* (2023.02); *G11C 5/063* (2013.01); *H10W 90/00* (2026.01); *H10W 90/295* (2026.01); *H10W 90/297* (2026.01); *H10W 90/722* (2026.01)

(58) Field of Classification Search

None

See application file for complete search history.

(56) References Cited

U.S. PATENT DOCUMENTS

| | | | | |
|---|---|---|---|---|
| 10,635,535 | B2 | 4/2020 | Cha et al. | |
| 11,386,004 | B2 | 7/2022 | Keeth et al. | |
| 11,488,944 | B2 | 11/2022 | Kim et al. | |
| 11,791,325 | B2 | 10/2023 | Baek | |
| 2018/0157782 | A1* | 6/2018 | Rossi | G06F 30/392 |
| 2019/0198061 | A1* | 6/2019 | Oh | G06F 12/084 |
| 2019/0243708 | A1 | 8/2019 | Cha et al. | |

(Continued)

FOREIGN PATENT DOCUMENTS

| | | | |
|---|---|---|---|
| CN | 115617739 | A | 1/2023 |
| KR | 10-2022-0013735 | A | 2/2022 |

*Primary Examiner* — Kaushikkumar M Patel

(74) *Attorney, Agent, or Firm* — MORGAN, LEWIS & BOCKIUS LLP

(57) ABSTRACT

A memory device includes: first and second core dies that include a plurality of memory cells and are stacked in a first direction, and a buffer die that is stacked with the first and second core dies in the first direction and includes a first physical layer and a second physical layer, wherein the buffer die is configured to output data of the plurality of memory cells through the first physical layer, wherein the data of the plurality of memory cells is provided from the first and second core dies through through-vias that pass through the first and second core dies in the first direction, and wherein the second physical layer is separated from the first physical layer and is configured to receive power signals from outside.

20 Claims, 13 Drawing Sheets

(56) References Cited

U.S. PATENT DOCUMENTS

| | | | |
|---|---|---|---|
| 2020/0272560 | A1 | 8/2020 | Keeth et al. |
| 2022/0028848 | A1 | 1/2022 | Baek |
| 2022/0189934 | A1 | 6/2022 | Kim et al. |
| 2022/0238504 | A1 | 7/2022 | Kim et al. |
| 2022/0327083 | A1 | 10/2022 | Das Sharma et al. |
| 2022/0334983 | A1 | 10/2022 | Kumashikar et al. |
| 2022/0405167 | A1* | 12/2022 | Lee ........................ G06F 11/004 |
| 2023/0139599 | A1* | 5/2023 | Jing ........................ G11C 5/063<br>711/154 |
| 2023/0197682 | A1 | 6/2023 | Collins et al. |

* cited by examiner

1a

10a

1b

MEMORY DEVICE AND A MEMORY SYSTEM INCLUDING THE MEMORY DEVICE

CROSS-REFERENCE TO RELATED APPLICATION

This application claims priority under 35 U.S.C. § 119 to Korean Patent Application No. 10-2023-0134570, filed in the Korean Intellectual Property Office on Oct. 10, 2023, the disclosure of which is incorporated by reference herein in its entirety.

TECHNICAL FIELD

The present inventive concept relates to a memory device and a memory system including the memory device.

DISCUSSION OF THE RELATED ART

Due to poor heat management performance, performance characteristics of power input/output may deteriorate as semiconductor processes are increased and chip sizes are decreased.

Similarly, with the emphasis on data-centric computing, large-capacity memories are desired; however, since there is a physical limitation in integrating large-capacity memories in a single chip, a method of coupling multiple memory chips by using chiplet structures and so on is under development.

In addition, since interfaces between chiplets are different from interfaces that are mainly used between memory chips, there may be difficulties in coupling logic chips and memory chips together.

SUMMARY

According to an embodiment of the present inventive concept, a memory device includes: first and second core dies that include a plurality of memory cells and are stacked in a first direction, and a buffer die that is stacked with the first and second core dies in the first direction and includes a first physical layer and a second physical layer, wherein the buffer die is configured to output data of the plurality of memory cells through the first physical layer, wherein the data of the plurality of memory cells is provided from the first and second core dies through through-vias that pass through the first and second core dies in the first direction, and wherein the second physical layer is separated from the first physical layer and is configured to receive power signals from outside.

According to an embodiment of the present inventive concept, a memory system includes: a host device configured to output data signals, an interposer that is coupled to the host device and includes signal lines in which the data signals are transferred and a memory device that includes a first physical layer and a second physical layer, wherein the first physical layer is configured to receive the data signals through the signal lines and the interposer, and the second physical layer is different from the first physical layer and is configured to receive a power signal from the interposer.

According to an embodiment of the present inventive concept, a memory system includes: a memory device that includes a first physical layer and a second physical layer, wherein the first physical layer is configured to output data signals and is a UCIe physical layer, and the second physical layer is separated from the first physical layer and is configured to receive a power signal, and a host device that includes a third physical layer and a fourth physical layer, wherein the third physical layer is configured to receive the data signals that are output through the first physical layer, and the fourth physical layer is separated from the third physical layer and is configured to provide the power signal to the memory device through the second physical layer.

DETAILED DESCRIPTION OF THE EMBODIMENTS

Figure 1:
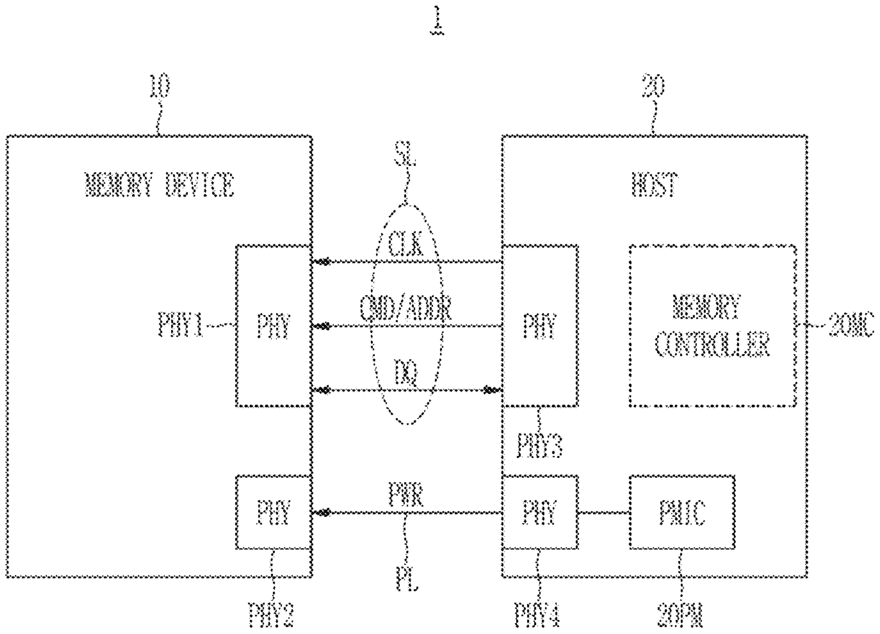
FIG. 1 is a block diagram illustrating the configuration of a memory system according to an embodiment of the present inventive concept.

Embodiments of the present inventive concept will be described more fully hereinafter with reference to the accompanying drawings. As those skilled in the art would realize, the described embodiments may be modified in various different ways, all without departing from the spirit and scope of the present inventive concept.

The drawings and description are to be regarded as illustrative in nature and not restrictive. Like reference numerals designate like elements throughout the specification and drawings, and thus, their descriptions may be omitted.

In the drawings, various thicknesses, lengths, and angles are shown and while the arrangement shown does indeed represent an embodiment of the present inventive concept, it is to be understood that modifications of the various thicknesses, lengths, and angles may be possible within the spirit and scope of the present inventive concept and the present inventive concept is not necessarily limited to the particular thicknesses, lengths, and angles shown.

FIG. 1 is a view illustrating the configuration of a memory system according to an embodiment of the present inventive concept.

Referring to FIG. 1, a memory system 1 may include a memory device 10 and a host device 20. The memory device 10 and the host device 20 may be coupled to each other through a plurality of physical layers PHY1 to PHY4 such that the memory device 10 and the host device 20 can communicate with each other. For example, the host device 20 may provide a clock signal CLK, commands CMD, addresses ADDR, data signals DQ, and a power signal PWR to the memory device 10 through the plurality of physical layers PHY1 to PHY4.

The memory device 10 may be a high bandwidth memory (HBM) device including a plurality of memory channels MCHa to MCHh (see FIG. 3); however, the memory device is not limited thereto, and may be a dynamic random access memory DRAM such as a double data rate synchronous dynamic random access memory (DDR SDRAM), a low-power double data rate (LPDDR) an SDRAM, a graphics double data rate (GDDR) SDRAM, a Rambus dynamic random access memory (RDRAM), etc. The plurality of memory channels MCHa to MCHh may include a memory cell array of FIG. 5 including a plurality of memory cells.

The memory device 10 may include the first physical layer PHY1 and the second physical layer PHY2. The first physical layer PHY1 and the second physical layer PHY2 may be of different types from each other, and may be disposed separately in the memory device 10.

The memory device 10 may receive the clock signal CLK, commands CMD, and addresses ADDR through the first physical layer PHY1, and may transmit and receive data signals DQ through the first physical layer PHY1. In embodiments of the present inventive concept, the first physical layer PHY1 may be a component of an interface for die-to-die communication and be a physical layer (hereinafter, referred to as PHY) which is the lowest physical layer. In embodiments of the present inventive concept, the first physical layer PHY1 may be a physical layer of a high-speed serial interface.

In embodiments of the present inventive concept, the first physical layer PHY1 may physically couple systems to transmit data, perform conversion on and control electrical signals, synchronization with the clock signal, link training, etc., and control components related to a sideband for receiving the clock signal, and so on.

In embodiments of the present inventive concept, the memory device 10 may receive the clock signal CLK, commands CMD, and addresses ADDR from an interposer through the first physical layer PHY1 and a signal line SL, and may transmit and receive data signals DQ to and from the interposer through the first physical layer PHY1.

In embodiments of the present inventive concept, the first physical layer PHY1 may be a universal chiplet interconnection express (UCIe) PHY based on UCIe which is an open standard. In addition, the first physical layer PHY1 may comply with the electrical signal standards, the number of physical lanes, and bump pitch requirements presented in the UCIe.

For example, when the first physical layer PHY1 is a UCIe PHY and operates at the standard package level, the first physical layer PHY1 may be designed with specifications such as a data signal rate of about 4 GT/s to about 32 GT/s, 16 physical lanes, a bump pitch of about 100 μm to about 130 μm, a channel reach of about 25 mm or less, etc. Further, for example, when the first physical layer PHY1 is a UCIe PHY and operates at an advanced package level, the first physical layer PHY1 may be designed with specifications such as a data signal rate of about 4 GT/s to about 32 GT/s, 64 physical lanes, a bump pitch of about 25 μm to about 55 μm, a channel reach of about 2 mm or less, etc.

In embodiments of the present inventive concept, the first physical layer PHY1 may include a serializer/deserializer 295S. The first physical layer PHY1 may perform read and write operations based on the number of data terminals that are disclosed in the memory device 10 while complying with the UCIe which is an open standard, by the serializer/deserializer 295S. The memory device 10 may perform serialization and deserialization depending on write operations and read operations.

In embodiments of the present inventive concept, in terms of the interoperability of the first physical layer PHY1, the voltage swing of data signals DQ that are input to the first physical layer PHY1 may be about 0.8 V or smaller, for example, 0.7 V or smaller. For example, when 0 V is applied as a ground voltage to the first physical layer PHY1, the maximum voltage of a data signal DQ that is applied to the first physical layer PHY1 may be about 0.8 V.

Further, in embodiments of the present inventive concept, the first physical layer PHY1 may perform a training operation on a reference voltage. On the basis of the trained reference voltage, data signals DQ that are input to the first physical layer PHY1 may be received as data.

Due to the above-mentioned specifications for the first physical layer PHY1, the first physical layer PHY1 can operate at a low voltage and low power with high power efficiency.

In embodiments of the present inventive concept, when the first physical layer PHY1 is a UCIe PHY, the memory device 10 and the host device 20 may support protocols including peripheral component interconnect express (hereinafter, referred to as PCIe) protocols, compute express link (hereinafter, referred to as CXL) protocols, streaming protocols, etc., but the present inventive concept is not limited thereto. The CXL protocols may include CXL.ip, CXL.mem, CXL.cache, etc., but are not limited thereto.

The memory device 10 may receive a power signal PWR through the second physical layer PHY2. In embodiments of the present inventive concept, the second physical layer PHY2 may be a component of an interface for die-to-die communication and be a physical layer (hereinafter, referred to as PHY) which is the lowest physical layer. In embodiments of the present inventive concept, the memory device 10 may receive the power signal PWR from the interposer through the second physical layer PHY2. In embodiments of the present inventive concept, the memory device 10 may receive a power voltage, a drive voltage, a word line boosting voltage, and a ground voltage for the memory device 10 through the power signal PWR, without arranging a separate charge pump.

In embodiments of the present inventive concept, the second physical layer PHY2 may be one of high-bandwidth memory (HBM) 2E/2 PHYs and HBM3 PHYs complying with JEDEC HBM, or may be one of high-bandwidth interconnect (hereinafter, referred to as HBI) (HBI) PHYs, DDR5/4 PHYs, and ultra-short reach/extra-short reach (USR/XSR) PHYs, but the present inventive concept is not limited thereto.

The host device 20 may include the third physical layer PHY3, the fourth physical layer PHY4, a memory controller 20MC, and a power management integrated circuit 20PM. In the host device 20, the third physical layer PHY3 and the fourth physical layer PHY4 may be of different types from each other and may be disposed separately in the host device 20.

The host device 20 may be in the form of a separate logic chip or a plurality of chiplets. In embodiments of the present inventive concept, the host device 20 may be a system-on-chip (SoC), a graphic processing unit (GPU) die, a central processing unit (CPU) die, or the like. In embodiments of the present inventive concept, the host device 20 may include the memory controller 20MC.

The memory controller 20MC may provide various signals to the memory device 10 through the third physical layer PHY3 and the fourth physical layer PHY4, thereby controlling memory operations such as write operations, read operations, and the like.

The third physical layer PHY3 may correspond to the first physical layer PHY1, and the memory controller 20MC may transmit the clock signal CLK, commands CMD, and addresses ADDR to the memory device 10 through the third physical layer PHY3 and the signal line SL and may transmit and receive data signals DQ to and from the memory device 10 through the third physical layer PHY3 and the signal line SL.

In embodiments of the present inventive concept, the third physical layer PHY3 may be a UCIe PHY. The third physical layer PHY3 may comply with requirements presented in the UCIe which is an open standard. The presented requirements may be the requirements described as an example in association with the first physical layer PHY1.

The fourth physical layer PHY4 may correspond to the second physical layer PHY2, and the host device 20 may provide a power signal PWR generated by the power management integrated circuit 20PM to the memory device 10 through the fourth physical layer PHY4 and a power line PL.

In embodiments of the present inventive concept, the fourth physical layer PHY4 may be one of HBM 2E/2 PHYs and HBM3 PHYs complying with JEDEC HBM, or may be one of HBI PHYs, DDR5/4 PHYs, and USR/XSR PHYs, but the present inventive concept is not limited thereto.

The power management integrated circuit 20PM may provide drive voltages to various components of the memory system 1 including the host device 20, or may perform power management on these components.

For example, the power management integrated circuit 20PM may provide the drive voltages (for example, a drive voltage VDD in FIG. 5 and a boosting voltage VPP in FIG. 5) to the memory device 10 through the second physical layer PHY2 and the fourth physical layer PHY4, and may adjust a drive voltage for the host device 20 as needed. For example, the power management integrated circuit 20PM may reduce the drive voltage for the host device 20 when it is required to secure the duration of the host device 20, or may stop providing the drive voltage for power saving. In addition, when it is required to secure the performance of the host device 20, the power management integrated circuit 20PM may increase the drive voltage for the host device 20.

Figure 2:
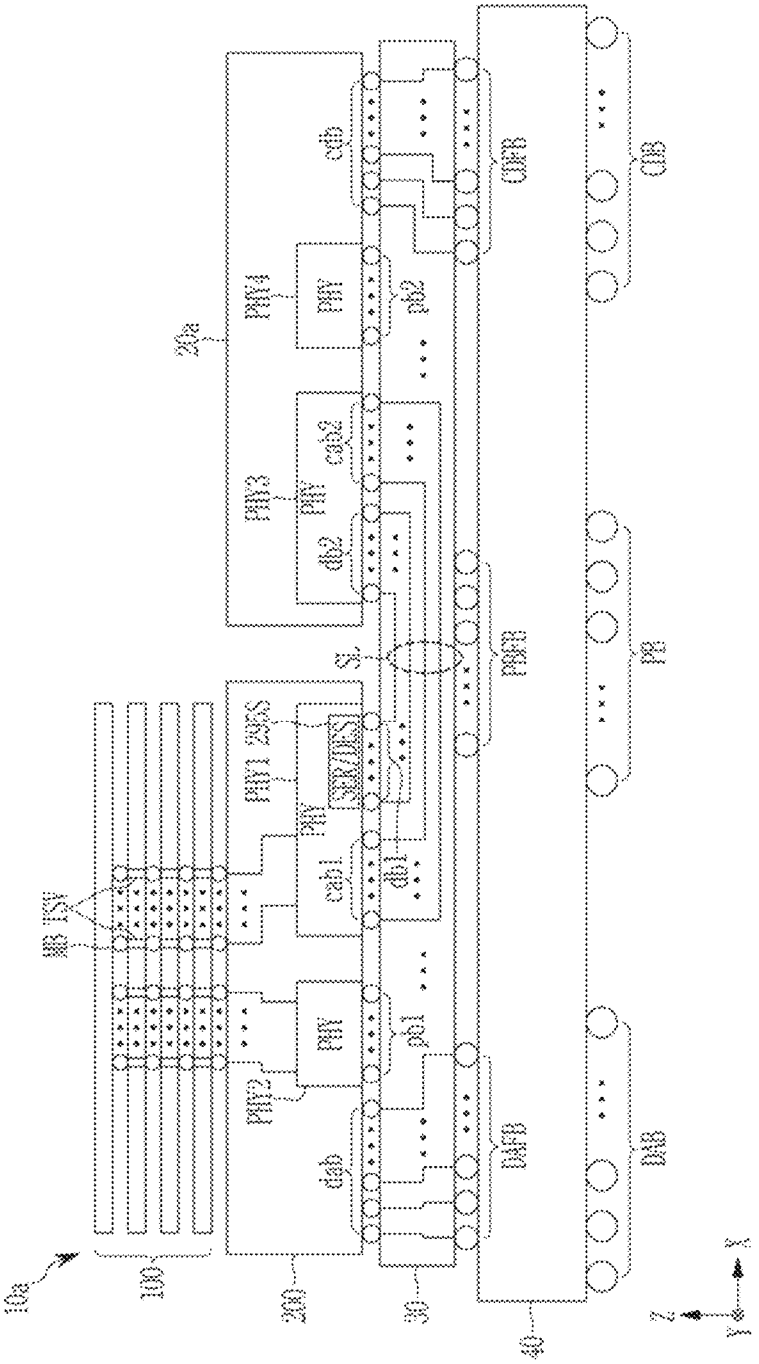
FIG. 2 is a view illustrating a memory system according to an embodiment of the present inventive concept.
Figure 3:
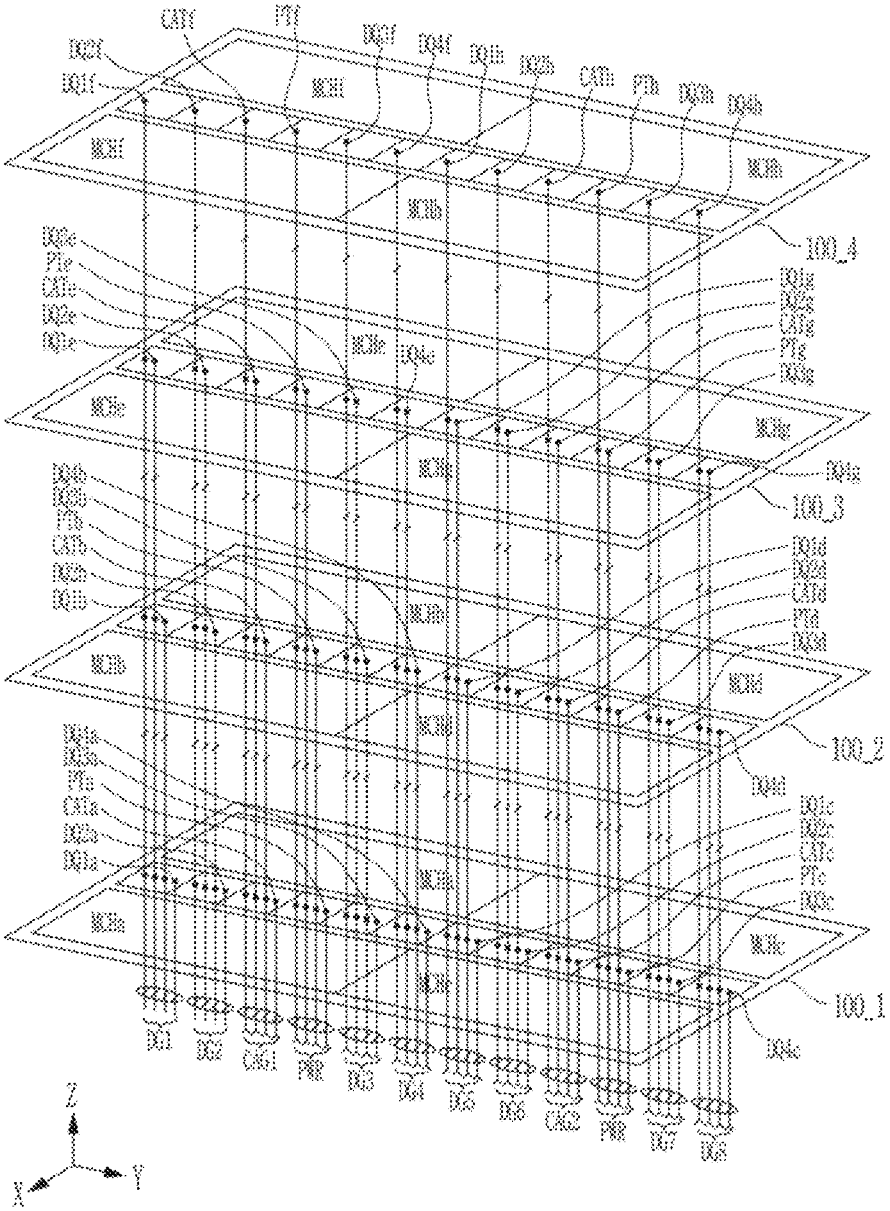
FIG. 3 is a view illustrating the configuration of a core die structure according to an embodiment of the present inventive concept.
Figure 4:
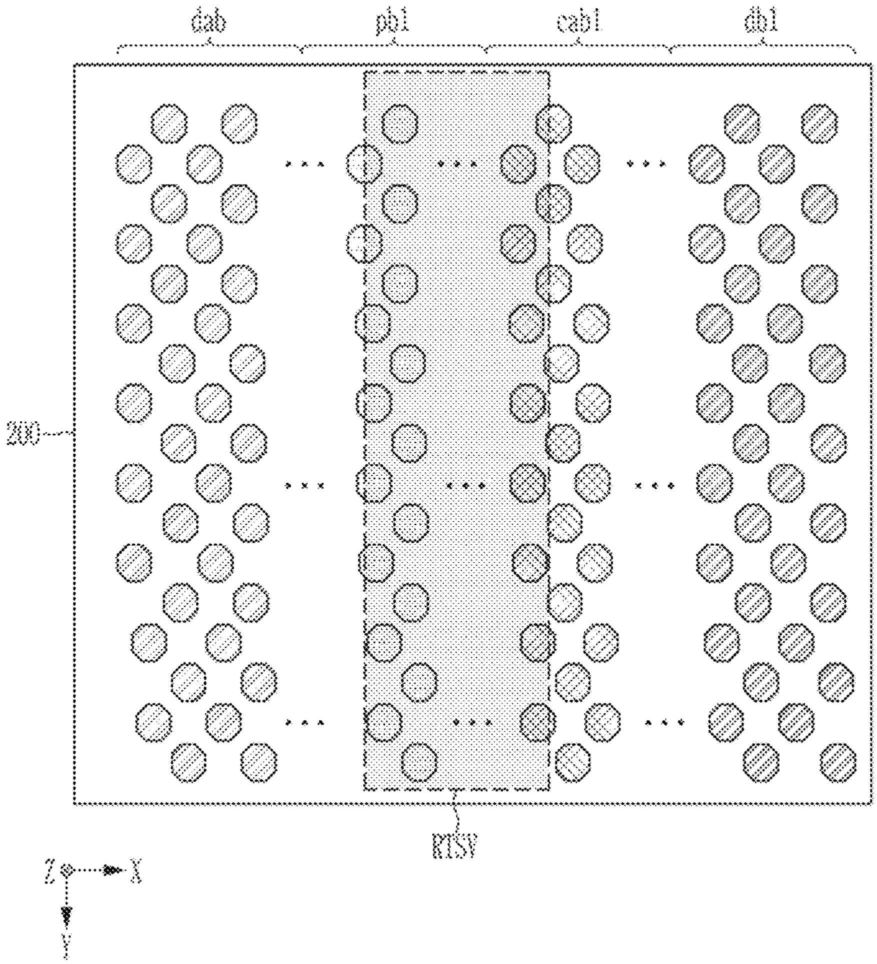
FIG. 4 is a view illustrating the lower surface of a buffer die according to an embodiment of the present inventive concept.

FIG. 2 is a view illustrating a memory system according to an embodiment of the present inventive concept. FIG. 3 is a view illustrating the configuration of a core die structure according to an embodiment of the present inventive concept. FIG. 4 is a view illustrating the lower surface of a buffer die according to an embodiment of the present inventive concept.

Referring to FIG. 1 to FIG. 4, a memory system 1*a* may include a memory device 10*a*, a host device 20*a*, an interposer 30, and a printed circuit board (PCB) 40.

The memory device 10*a* and the host device 20*a* may be disposed and mounted on the interposer 30. The memory device 10*a* and the host device 20*a* may be disposed so as not to overlap each other in a third direction Z. For example, the memory device 10*a* and the host device 20*a* may be disposed side-by-side on the interposer 30.

The memory device 10*a* may include a memory die 100 including four core dies 100_1 to 100_4 that are stacked on each other in the third direction Z, and a buffer die 200. Between every two dies of the core dies 100_1 to 100_4 stacked and between a die of the core dies 100_1 to 100_4 and the buffer die 200 stacked, a plurality of first bumps MB may be formed, and between a plurality of stacked first bumps MB, through-silicon vias (TSVs) may be formed to pass through the core dies 100_1 to 100_4.

In embodiments of the present inventive concept, the memory device 10*a* may include five or more core dies stacked. In embodiments of the present inventive concept, the buffer die 200 may be stacked above the stacked core dies 100_1 to 100_4, and not below the stacked core dies 100_1 to 100_4.

FIG. 3 is a drawing illustrating the configuration of the four stacked core dies 100_1 to 100_4 according to an embodiment of the present inventive concept, and the stacked core dies 100_1 to 100_4 may include two memory channels MCHa and MCHc, two memory channels MCHb and MCHd, two memory channels MCHe and MCHg, and two memory channels MCHf and MCHh, respectively, and each of the memory channels MCHa to MCHh may include a predetermined number of memory banks.

The memory channels MCHa, MCHb, MCHe, and MCHf may be disposed on the left sides of the core dies 100_1 to 100_4 in X-Y planes, respectively, and the memory channels MCHc, MCHd, MCHg, and MCHh may be disposed on the right sides of the core dies 100_1 to 100_4 in the X-Y planes, respectively. Each of the memory channels MCHa, MCHb, MCHe, and MCHf are disposed separately in a Z direction in the corresponding core die of the core dies 100_1 to 100_4. Each of the memory channels MCHc, MCHd, MCHg, and MCHh are disposed separately in a Z direction in the corresponding core die of the core dies 100_1 to 100_4.

Between each of memory channels MCHa, MCHb, MCHe, and MCHf, corresponding data terminals DQ1*a* to DQ4*a*, DQ1*b* to DQ4*b*, DQ1*e* to DQ4*e*, or DQ4*f* to DQ4*f*, corresponding command and address terminals CATa, CATb, CATe, or CATf, and a corresponding power terminal PTa, PTb, PTe, or PTf may be included, and between each memory channels MCHc, MCHd, MCHg, and MCHh, corresponding data terminals DQ1*c* to DQ4*c*, DQ1*d* to DQ4*d*, DQ1*g* to DQ4*g*, or DQ1*h* to DQ4*h*, corresponding command and address terminals CATc, CATd, CATg, or CATh, and a corresponding power terminal PTc, PTd, PTg, or PTh may be included. Through the data terminals DQ1*a*, DQ1*b*, DQ1*e*, and DQ1*f*, a first data group DG1 may be transferred, and through the data terminals DQ2*a*, DQ2*b*, DQ2*e*, and DQ2*f*, a second data group DG2 may be transferred. In this way, through other data terminals DQ3*a* to DQ4*h*), third to eighth data groups DG3 to DG8 may be transferred.

Through the command and address terminals CATa, CATb, CATe, and CATf, a first command and address group CAG1 may be transferred, and through the command and address terminals CATc, CATd, CATg, and CATh, a second command and address group CAG2 may be transferred. The power signal PWR may be transferred through power terminals PTa to PTh.

The corresponding data terminals DQ1*a* to DQ4*a*, DQ1*b* to DQ4*b*, DQ1*c* to DQ4*c*, DQ1*d* to DQ4*d*, DQ1*e* to DQ4*e*, DQ1*f* to DQ4*f*, DQ1*g* to DQ4*g*, and DQ1*h* to DQ4*h* and the corresponding command and address terminals CATa to CATh may be coupled to the first physical layer PHY1. The power terminals PTa to PTh may be coupled to the second physical layer PHY2.

In FIG. 3, the data terminals DQ1*a* to DQ4*a*, DQ1*b* to DQ4*b*, DQ1*c* to DQ4*c*, DQ1*d* to DQ4*d*, DQ1*e* to DQ4*e*, DQ1*f* to DQ4*f*, DQ1*g* to DQ4*g*, and DQ1*h* to DQ4*h*, the command and address terminals CATa to CATh, and the power terminals PTa to PTh may be the plurality of first bumps MB shown in FIG. 2, respectively. Further, lines vertically passing through the data terminals DQ1*a* to DQ4*a*, DQ1*b* to DQ4*b*, DQ1*c* to DQ4*c*, DQ1*d* to DQ4*d*, DQ1*e* to DQ4*e*, DQ1*f* to DQ4*f*, DQ1*g* to DQ4*g*, and DQ1*h* to DQ4*h*, the command and address terminals CATa to CATh, and the power terminals PTa to PTh may be the through-silicon vias (TSVs).

If it is assumed that n bits of data are input and output through each of the data terminals DQ1*a* to DQ4*a*, . . . , DQ1*h* to DQ4*h*, 32*n* bits of data can be input and output through all data terminals. If it is assumed that k bits of commands and addresses are input and output through each of the command and address terminals CATa to CATh, 8*k* bits of commands and addresses can be input and output through all command and address terminals.

As shown in FIG. 3, vertical penetrating lines for the second to eight data groups DG2 to DG8 may be configured like the lines corresponding to the first data group DG1, and vertical penetrating lines for the second command and address group CAG2 may be configured like the lines corresponding to the first command and address group CAG1.

Each of the core dies 100_1 to 100_4 shown in FIG. 2 and FIG. 3 may receive a drive voltage and a boosting voltage for the plurality of memory cells in the memory cell array, through the power terminals. Each of the core dies 100_1 to 100_4 may store data input through the data terminals DQ1*a* to DQ4*a*, DQ1*b* to DQ4*b*, DQ1*c* to DQ4*c*, DQ1*d* to DQ4*d*, DQ1*e* to DQ4*e*, DQ1*f* to DQ4*f*, DQ1*g* to DQ4*g*, and DQ1*h* to DQ4*h*, in memory cells selected from the plurality of memory cells in the memory cell array, or output data stored in selected memory cells through the data terminals DQ1*a* to DQ4*a*, DQ1*b* to DQ4*b*, DQ1*c* to DQ4*c*, DQ1*d* to DQ4*d*, DQ1*e* to DQ4*e*, DQ1*f* to DQ4*f*, DQ1*g* to DQ4*g*, and DQ1*h* to DQ4*h*, in response to a command and addresses applied through the command and address terminals CATa to CATh.

Referring to FIG. 2 and FIG. 4 again, a plurality of first direct access bumps dab, a plurality of first power bumps pb1, a plurality of first command and address bumps cab1, and a plurality of first data bumps db1 may be disposed on the lower surface of the buffer die 200 in the third direction Z.

In addition, the buffer die 200 may include the first physical layer PHY1 and the second physical layer PHY2. The first physical layer PHY1 may be coupled to the plurality of first data bumps db1 and the plurality of first command and address bumps cab1 and may transmit and receive data signals DQ. The second physical layer PHY2 may be coupled to the plurality of first power bumps pb1 and may receive the power signal PWR from the host device 20*a*.

The first physical layer PHY1 may be coupled to some of the plurality of through-silicon vias (TSVs) that are disposed on the upper surface of the buffer die 200 to transmit and receive data of the memory die 100. The second physical layer PHY2 may be coupled to some of the plurality of through-silicon vias (TSVs) to provide the power signal PWR to the memory die 100.

The first physical layer PHY1 may be disposed to overlap at least some of the plurality of first command and address bumps cab1 and the plurality of first data bumps db1 in the third direction Z. The second physical layer PHY2 may be disposed to overlap at least some of the plurality of first power bumps pb1 in the third direction Z.

In embodiments of the present inventive concept, a TSV region RTSV may be at least a partial region which is related to the upper surface of the buffer die 200 and in which the through-silicon vias (TSVs) are disposed. The TSV region RTSV may be disposed to overlap at least some of the plurality of first command and address bumps cab1 and the plurality of first power bumps pb1 in the third direction Z. In embodiments of the present inventive concept, the TSV region RTSV may be disposed to overlap some of the plurality of first data bumps db1 plane-wise in the third direction Z. Further, the TSV region RTSV may be disposed to overlap a portion of the first physical layer PHY1 and a portion of the second physical layer PHY2 in the third direction Z. In embodiments of the present inventive concept, the TSV region RTSV may be disposed between the first physical layer PHY1 and the second physical layer PHY2 in an XY plane.

A plurality of second command and address bumps cab2, a plurality of second data bumps db2, a plurality of second power bumps pb2, and a plurality of first control signal bumps cdb may be disposed on the lower surface of the host device 20*a*. The host device 20*a* may include the third physical layer PHY3 and the fourth physical layer PHY4. The third physical layer PHY3 may be coupled to the plurality of second data bumps db2 and the plurality of second command and address bumps cab2 and may transmit and receive data signals DQ. The fourth physical layer PHY4 may be coupled to the plurality of second power bumps pb2 and may provide the power signal PWR to the memory device 10*a*.

The plurality of first bumps MB, the plurality of first direct access bumps dab, the plurality of first and second power bumps pb1 and pb2, and the plurality of first and second command and address bumps cab1 and cab2, the plurality of first and second data bumps db1 and db2, and the plurality of first control signal bumps cdb may be micro bumps.

In embodiments of the present inventive concept, the interposer 30 may include a silicon interposer, an organic interposer, etc., but is not limited thereto. In embodiments of the present inventive concept, instead of disposing the interposer 30 on the PCB 40, an embedded multi-die interconnect bridge (EMIB) may be disposed inside the PCB 40. By disposing the interposer 30 or the EMIB, the memory system 1 can operate at an advanced package level.

A plurality of second direct access bumps DAFB, a plurality of third power bumps PBFB, and a plurality of second control signal bumps CDFB may be disposed on the lower surface of the interposer 30. The interposer 30 may be disposed between the PCB 40 and the memory device 10*a* and between the host device 20*a* and the PCB 40. In embodiments of the present inventive concept, the interposer may include conductive redistribution lines, through-silicon vias that are vertical structures, etc.

In embodiments of the present inventive concept, the interposer 30 may include direct lines, signal lines SL, power lines PL, and a plurality of control signal lines. The direct lines couple the plurality of first direct access bumps dab and the plurality of second direct access bumps DAFB to each other. The signal lines SL couple the plurality of first command and address bumps cab1 and the plurality of second command and address bumps cab2 to each other, and couple the plurality of first data bumps db1 and the plurality of second data bumps db2 to each other. The power lines PL couple the plurality of first power bumps pb1 and the plurality of second power bumps pb2 to each other. The plurality of control signal lines couple the plurality of first control signal bumps cdb and the plurality of second control signal bumps CDFB to each other. In addition, the interposer 30 may include power lines that couple the plurality of third power bumps PBFB and the plurality of second power bumps pb2 of the host device 20*a* to each other.

A plurality of direct access balls DAB, a plurality of power balls PB, and a plurality of control signal balls CDB may be disposed on the lower surface of the PCB 40.

Through the PCB 40, the plurality of second direct access bumps DAFB and the plurality of direct access balls DAB may be coupled to each other, and the plurality of third power bumps PBFB and the plurality of power balls PB may be coupled to each other. In addition, the plurality of second control signal bumps CDFB and the plurality of control signal balls CDB may be coupled to each other through the PCB 40.

In some embodiments of the present inventive concept, when the memory device 10*a* and the host device 20*a* are disposed on the PCB 40, without disposing the interposer 30, and the memory device 10*a* and the host device 20*a* are coupled to each other through the PCB 40, the memory system 1 may operate at the standard package level.

Figure 5:
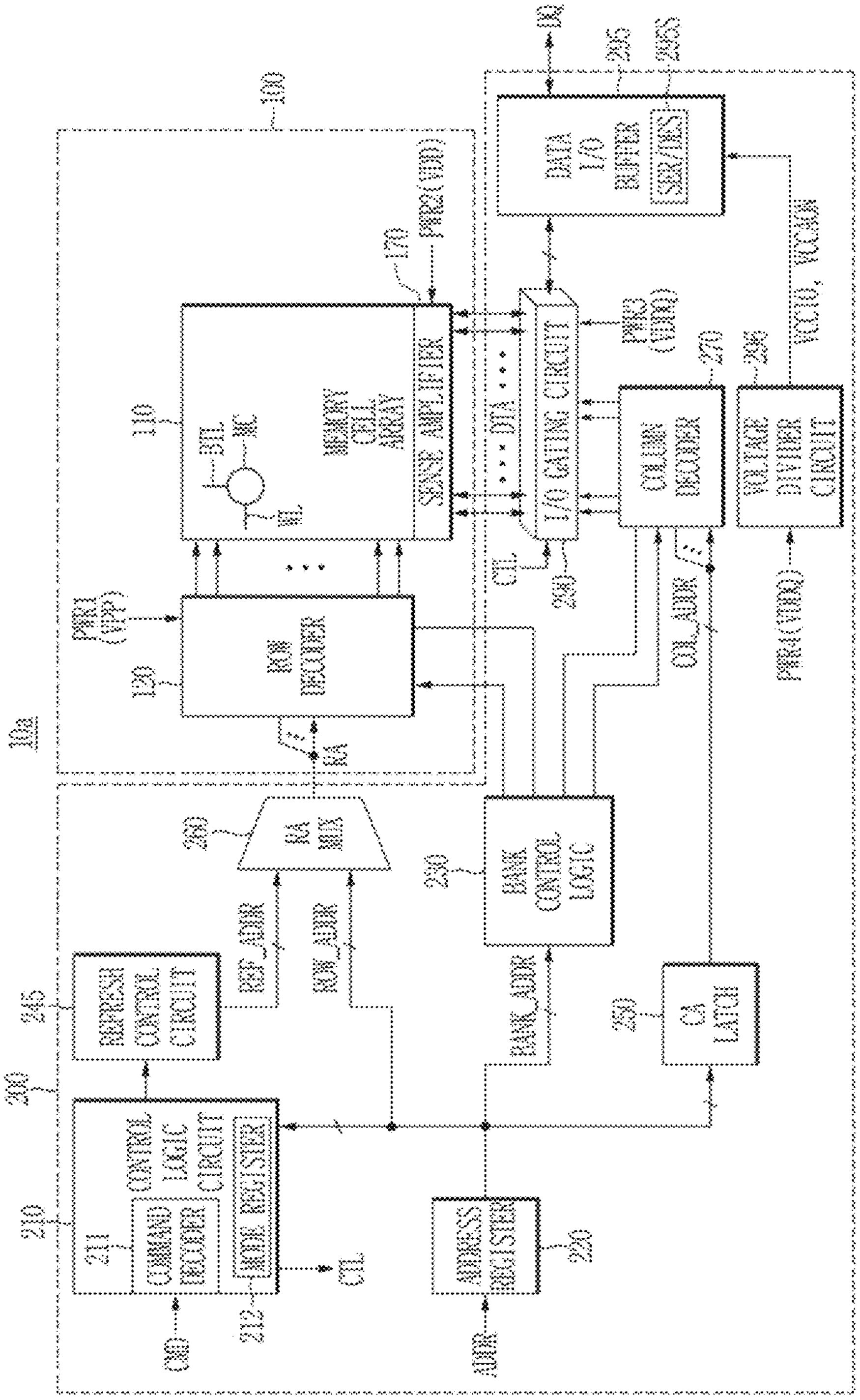
FIG. 5 is a block diagram illustrating the configuration of a memory device according to an embodiment of the present inventive concept.

FIG. 5 is a block diagram illustrating the configuration of the memory device according to an embodiment of the present inventive concept.

Referring to FIG. 1 to FIG. 5, the memory device 10*a* may include a memory cell array 110, a row decoder 120, a sense amplifier 170, a control logic circuit 210, an address register 220, a bank control logic 230, a refresh control circuit 245, a column address latch 250, a row address multiplexer 260, a column decoder 270, an I/O gating circuit 290, a data I/O buffer 295, and a voltage divider circuit 296.

The memory cell array 110 may include the predetermined number of memory banks including the memory channels MCHa to MCHh. Further, in embodiments of the present inventive concept, the sense amplifier 170, the row decoder 120, and the column decoder 270 may include a plurality of bank sense amplifiers, a plurality of bank row decoders, and a plurality of bank column decoders coupled to the individual memory banks, respectively, but the present inventive concept is not limited thereto.

The memory cell array 110 may include a plurality of word lines WL, a plurality of bit lines BL, and the plurality of memory cells MC that are positioned at the intersections between the word lines WL and the bit lines BL.

The row decoder 120 may be coupled to the plurality of word lines WL, and may apply the boosting voltage VPP to the word lines corresponding to target memory cells during write operations and read operations. For example, the word lines receiving the boosting voltage VPP may be activated, and the memory cells coupled to the activated word lines may be turned on.

In embodiments of the present inventive concept, the row decoder 120 may receive a first power signal PWR1 through the second physical layer PHY2 and the through-silicon vias (TSVs), and apply the boosting voltage VPP to the word lines through the first power signal PWR1. In embodiments of the present inventive concept, the boosting voltage VPP may be in a range from about 1.5 V to about 3.0 V, for example, in a range from about 1.6 V to about 2.6 V, and for example, in a range from about 1.7 V to about 1.9 V.

The sense amplifier 170 may include bit-line sense amplifiers coupled to the plurality of bit lines BL, and during write operations and read operations, the bit-line sense amplifiers corresponding to the memory cells may receive the drive voltage VDD and perform the write operations and the read operations on the memory cells.

In embodiments of the present inventive concept, the bit-line sense amplifiers in the sense amplifier 170 may receive a second power signal PWR2 through the second physical layer PHY2 and the through-silicon vias (TSVs), and may receive the drive voltage VDD for write operations and read operations through the second power signal PWR2. In embodiments of the present inventive concept, the drive voltage VDD may be in a range from about 1.0 V to about 1.4 V, and for example, in a range from about 1.1 V to about 1.2 V.

The control logic circuit 210 may control the operation of the memory device 10*a*. For example, the control logic circuit 210 may generate control signals CTL such that the memory device 10*a* perform a read operation or a write operation. The control logic circuit 210 may include a command decoder 211 for decoding commands CMD that are received from the memory controller 20MC, and a mode register 212 for setting the operation mode of the memory device 10*a*.

For example, the command decoder 211 may decode a write enable signal, a row address strobe signal, a column address strobe signal, a channel selection signal, etc., to generate a control signal CTL corresponding to a command CMD.

The mode register 212 may store setting information for setting the operation mode of the memory device 10*a*. The memory controller 20MC may provide a command for a mode register write operation MRW for storing the setting information in the mode register 212. In addition, the memory controller 20MC may provide a command for a mode register read operation MRR, thereby receiving the setting information stored in the mode register 212 from the memory device 10*a*.

The address register 220 may receive addresses ADDR including bank addresses BANK_ADDR, row addresses ROW_ADDR, and column addresses COL_ADDR from the memory controller 20MC. The address register 220 may provide the received bank addresses BANK_ADDR to the bank control logic 230, and may provide the received row addresses ROW_ADDR to the row address multiplexer 260.

The bank control logic 230 may generate bank control signals in response to the bank addresses BANK_ADDR. In response to the bank control signals, the row decoder 120 and the column decoder 270 may activate corresponding banks.

The row address multiplexer 260 may receive row addresses ROW_ADDR from the address register 220, and receive refresh row addresses REF_ADDR from the control logic circuit 210. The row address multiplexer 260 may selectively output the row addresses ROW_ADDR or the refresh row addresses REF_ADDR as row addresses RA. The row addresses RA output from the row address multiplexer 260 may be applied to the row decoder 120.

The column address latch 250 may receive column addresses COL_ADDR from the address register 220, and temporally store the received column addresses COL_ADDR. In addition, the column address latch 250 may gradually increase the received column addresses COL_ADDR in a burst mode. The column address latch 250 may apply the column addresses temporally stored or gradually increased to the column decoder 270.

With respect to banks activated by the bank control logic 230, the column decoder 270 may activate sense amplifiers corresponding to the bank addresses BANK_ADDR and the column addresses COL_ADDR through the I/O gating circuit 290.

The I/O gating circuit 290 may include an input data mask logic, read data latches for storing data DTA, and a write driver for writing data DTA along with circuits for gating I/O data.

In embodiments of the present inventive concept, the I/O gating circuit 290 may receive a third power signal PWR3 through the second physical layer PHY2 and the through-silicon vias (TSVs), and may receive a power voltage VDDQ for transfer, restoration, or the like of data DTA through the third power signal PWR3. In embodiments of the present inventive concept, the power voltage VDDQ may be in a range from about 1.0 V to about 1.4 V, and for example, in a range from about 1.1 V to about 1.2 V. When the memory device 10*a* is operating at a low speed, the power voltage VDDQ having a decreased magnitude may be input to the I/O gating circuit 290.

For example, during a write operation, the I/O gating circuit 290 may convert data signals DQ received from the data I/O buffer 295 into data DTA on the basis of the power voltage VDDQ, and transmit the data DTA to the sense amplifier 170. Further, during a read operation, the I/O gating circuit 290 may restore the data DTA received from the sense amplifier 170 on the basis of the power voltage VDDQ and transmit them to the data I/O buffer 295.

In addition, to support a burst mode for a burst length BL indicating the maximum number of column locations where it is possible to access bit lines in the memory device 10*a*, bit lines corresponding to a burst length BL may be accessed at the same time through the I/O gating circuit 290.

The data I/O buffer 295 may distinguish between input data signals and output data related to the first physical layer PHY1. In embodiments of the present inventive concept, the data I/O buffer 295 may include some components of the first physical layer PHY1, and may receive a control signal CTL from the control logic circuit 210 and control the operation of the first physical layer PHY1 to perform an input or output operation.

The data I/O buffer 295 may include the serializer/deserializer 295S. The serializer/deserializer 295S may perform an operation of deserializing data signal DQ and an operation of serializing data DTA according to write operations and read operations of the memory device 10*a*. For example, the memory device 10*a* may perform an operation on the memory die 100 while complying with the requirement for the number of physical lanes presented in the UCIe, through serializing and deserializing operations.

For example, when the memory device 10*a* performs a write operation, the serializer/deserializer 295S may perform an operation of deserializing a data signal DQ input to the physical lanes of the first physical layer PHY1. Further, when the memory device 10*a* performs a read operation, the serializer/deserializer 295S may perform an operation of serializing data DTA output from the I/O gating circuit 290 and output the data signal DQ to the physical lanes of the first physical layer PHY1.

Furthermore, the data I/O buffer 295 may synthesize a data signal DQ that is input from the memory controller 20MC and data DTA that is to be output to the memory controller 20MC with the clock signal. In addition, the data I/O buffer 295 may adjust a voltage level with respect to data DTA output from the I/O gating circuit 290 on the basis of an I/O voltage VCCIO, and the data I/O buffer 295 may output a data signal DQ. The voltage adjusted with respect to the data signal DQ may comply with the requirements of the standard with which the first physical layer PHY1 complies.

For example, the voltage swing of a data signal DQ may be about 0.9 V or smaller in compliance with the UCIe which is an open standard. In embodiments, the voltage of a data signal DQ may be in a range from about 0.2 V to about 0.6 V, and for example, in a range from about 0.3 V to about 0.5 V.

The voltage divider circuit 296 may receive a fourth power signal PWR4 through the second physical layer PHY2 and the through-silicon vias (TSVs), and receive the power voltage VDDQ through the fourth power signal PWR4.

The voltage divider circuit 296 may perform a voltage divide bias operation on the power voltage VDDQ. The voltage divider circuit 296 may provide the I/O voltage VCCIO and an auxiliary voltage VCCAON to the data I/O buffer 295 through the voltage divide bias operation on the power voltage VDDQ.

The voltage divider circuit 296 may provide the I/O voltage VCCIO and the auxiliary voltage VCCAON, which are voltages that are relatively lower than each of the boosting voltage VPP, the drive voltage VDD, and the power voltage VDDQ, to the data I/O buffer 295.

In embodiments of the present inventive concept, the voltage divider circuit 296 may perform a voltage divide bias operation on the power voltage VDDQ, but the present inventive concept is not limited thereto. For example, the voltage divider circuit 296 may perform a voltage divide bias operation on the basis of the power signal PWR that is provided to the second physical layer PHY2.

The auxiliary voltage VCCAON may be a voltage that is input to maintain the clock signal and firmware driving the memory device 10*a* and may be provided to the data I/O buffer 295. In embodiments of the present inventive concept, the auxiliary voltage VCCAON may be in a range from about 0.45 V to about 0.85 V, and for example, in a range from about 0.55 V to about 0.75 V.

The memory device 10*a* may receive a ground voltage through the second physical layer PHY2, and the received ground voltage may be applied to components in the memory device 10*a*. For example, the ground voltage may be 0 V, but the present inventive concept is not limited thereto.

The memory device 10*a* of the present inventive concept may receive power signals PWR including the first to fourth power signals PWR1 to PWR4 through the second physical layer PHY2, without a separate charge pump. By disposing the first physical layer PHY1 and the second physical layer PHY2 in the buffer die 200 in place of a separate charge pump, it is possible to apply an interface for logic chips to the memory device 10*a* and increase the power efficiency and area overhead of the memory device 10*a*.

In embodiments of the present inventive concept, the memory cell array 110, the row decoder 120, and the sense amplifier 170 may be included in the memory die 100, and the control logic circuit 210, the address register 220, the bank control logic 230, the refresh control circuit 245, the column address latch 250, the row address multiplexer 260, the column decoder 270, the I/O gating circuit 290, the data I/O buffer 295, and the voltage divider circuit 296 may be included in the buffer die 200.

Figure 6:
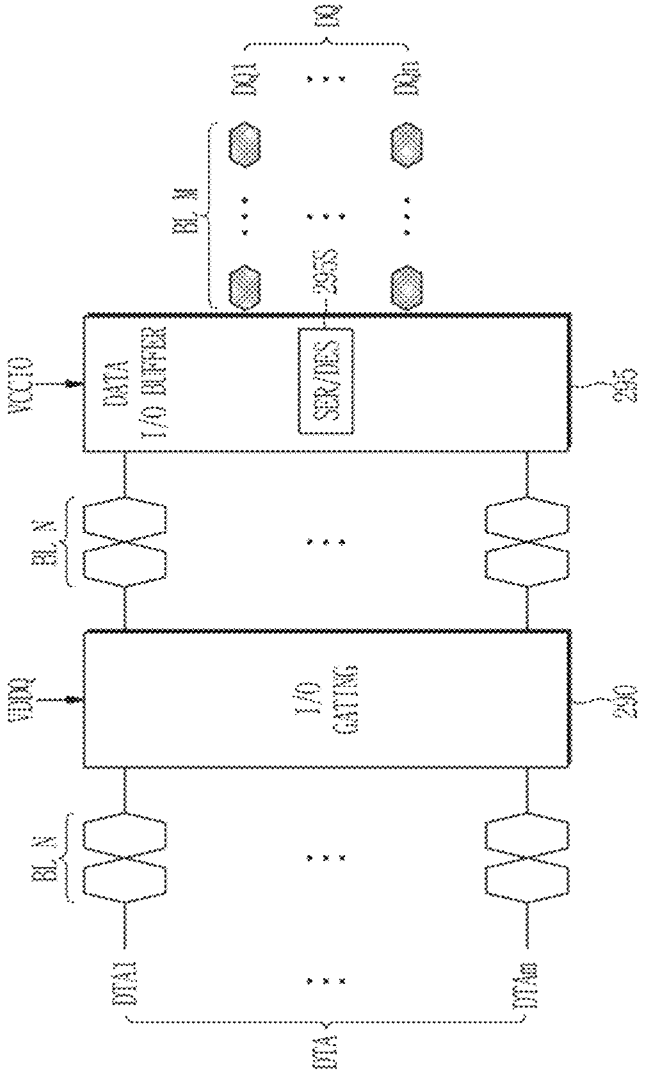
FIG. 6 and FIG. 7 are views illustrating an operation of the memory device according to an embodiment of the present inventive concept.
Figure 7:
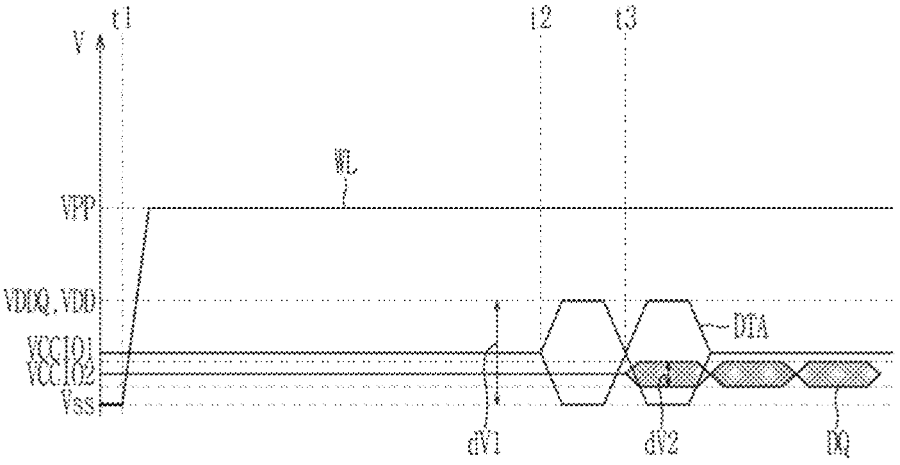

FIG. 6 and FIG. 7 are views illustrating an operation of the memory device according to an embodiment of the present inventive concept.

FIG. 6 and FIG. 7 are views illustrating a read operation of the memory device 10*a*. Referring to FIG. 1, FIG. 5, FIG. 6, and FIG. 7, when the memory device 10*a* performs a read operation, at a time t1, the voltage to be applied to the word lines WL may be raised from a ground voltage Vss to the boosting voltage VPP, whereby the word lines WL may be activated. For example, the ground voltage Vss may be 0 V and the boosting voltage VPP may be about 1.8 V, but they are not limited thereto.

On the basis of the activation of the word lines WL, at a time t2, the memory die 100 may perform a read operation based on the drive voltage VDD and provide data DTA to the I/O gating circuit 290. The I/O gating circuit 290 may restore the input data DTA on the basis of the power voltage VDDQ and provide the data DTA to the data I/O buffer 295.

The data DTA may include first to m-th data DTA1 to DTAm, and "m" may be determined by the number of data terminals in the memory die 100 and may be a whole number. The first to m-th data DTA1 to DTAm may be output together and may be output by different data terminals. For example, "m" may be equal to 1024, but is not limited thereto. In embodiments of the present inventive concept, the burst length BL of the first to m-th data DTA1 to DTAm may be equal to "N".

Further, the voltage of the data DTA may be in the range between the ground voltage Vss and the power voltage/drive voltage (VDDQ, VDD). For example, the ground voltage Vss may be 0 V and the power voltage/drive voltage (VDDQ, VDD) may be about 1.1 V, but the present inventive concept is not limited thereto. Data voltage swing dV1 which is the difference between the maximum voltage value and minimum voltage value of data DTA may be about 1.1 V, but the present inventive concept is not limited thereto.

At a time t3, the data I/O buffer 295 may convert the input data DTA into a data signal DQ on the basis of the I/O voltage VCCIO. The serializer/deserializer 295S may convert the first to m-th data DTA1 to DTAm into first to n-th data signals DQ1 to DQn while serializing them.

Data signals DQ may include the first to n-th data signals DQ1 to DQn, and "n" may be determined by the number of physical lanes of the first physical layer PHY1 and may be a whole number. The first to n-th data signals DQ1 to DQn may be output together, and may be output by different physical lanes. For example, "n" may be equal to 64, but the present inventive concept is not limited thereto. In embodiments of the present inventive concept, the burst length BL of the first to n-th data signals DQ1 to DQn may be equal to "M".

In embodiments of the present inventive concept, the ratio of the number of data DTA to the number of data signals DQ may be "m" to "n", and "m" to "n" may be the reciprocal of "N" to "M" which is the ratio of the burst length BL of data DTA to the burst length of data signals DQ. For example, when the number of data terminals from which the data DTA are output is 1024, the data DTA include first to 1024-th data, the number of physical lanes from which the data signals DQ are output is 64, and the data signals DQ include first to 64-th data signals, the ratio of the burst length BL of the data DTA to the burst length of the data signals DQ may be 1 to 16.

The voltage of the data signals DQ may be in the range between a first I/O voltage VCCIO1 and a second I/O voltage VCCIO2 based on the I/O voltage VCCIO. For example, the first I/O voltage VCCIO1 may be about 0.6 V, and the second I/O voltage VCCIO2 may be about 0.4V. For example, the data signal voltage swing dV2 which is the difference between the maximum voltage value and minimum voltage value of a data signal DQ may be about 0.2 V. However, the present inventive concept is not limited thereto. In embodiments of the present inventive concept, the magnitudes of the first and second I/O voltages VCCIO1 and VCCIO2 may be smaller than the magnitude of the provided I/O voltage VCCIO, and may be smaller than the magnitudes of the power voltage/drive voltage (VDDQ, VDD) and the boosting voltage VPP.

Figure 8:
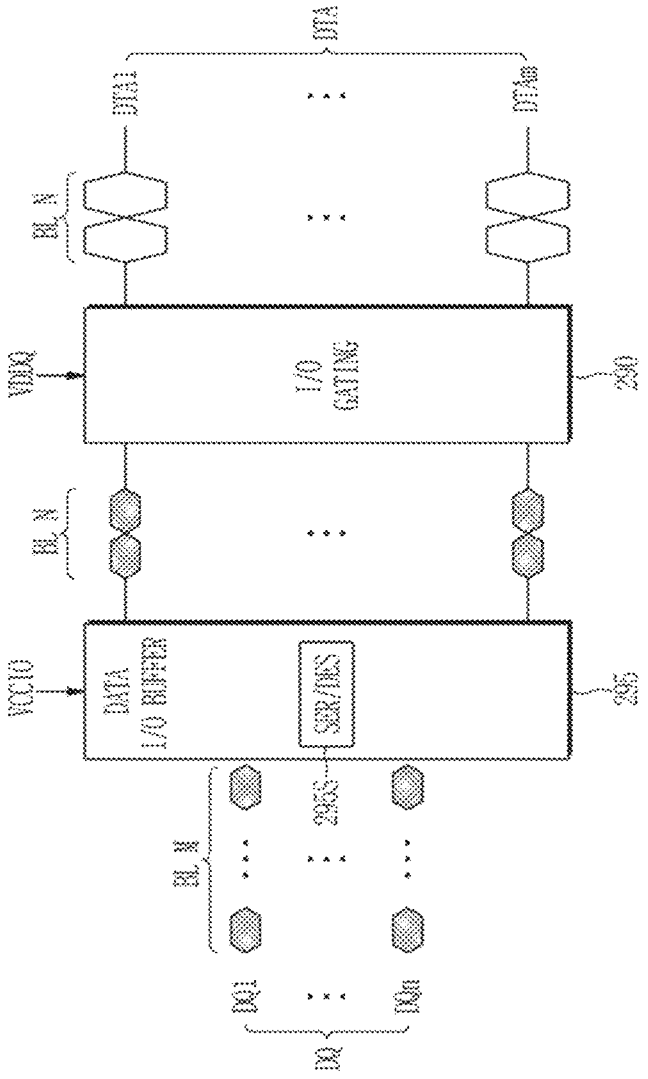
FIG. 8 is a view illustrating an operation of the memory device according to an embodiment of the present inventive concept.

FIG. 8 is a view illustrating an operation of the memory device according to an embodiment of the present inventive concept. FIG. 8 is a view illustrating a write operation of the memory device 10*a*. Referring to FIG. 1, FIG. 5, and FIG. 8, when the memory device 10*a* performs a write operation, the data I/O buffer 295 and the I/O gating circuit 290 may convert the data signals DQ into data DTA on the basis of the power voltage VDDQ.

The serializer/deserializer 295S of the data I/O buffer 295 may deserialize the first to n-th data signals DQ1 to DQn. Further, the data I/O buffer 295 may provide the data signals DQ that are obtained by deserializing to the I/O gating circuit 290.

The I/O gating circuit 290 may output the data signals DQ, which are obtained by deserializing based on the input power voltage VDDQ, as data DTA. The data DTA may include the first to m-th data DTA1 to DTAm.

In embodiments of the present inventive concept, the ratio of the number of data signals DQ to the number of data DTA may be "n" to "m", and "n" to "m" may be the reciprocal of "M" to "N" which is the ratio of the burst length BL of data signals DQ to the burst length of data DTA. For example, when the number of physical lanes to which the data signals DQ are input is 64, the data signals DQ include first to 64-th data signals, the number of data terminals to which the data DTA are input is 1024, and the data DTA includes first to 1024-th data, the ratio of the burst length BL of the data signals DQ to the burst length of the data DTA may be 16 to 1.

Figure 9:
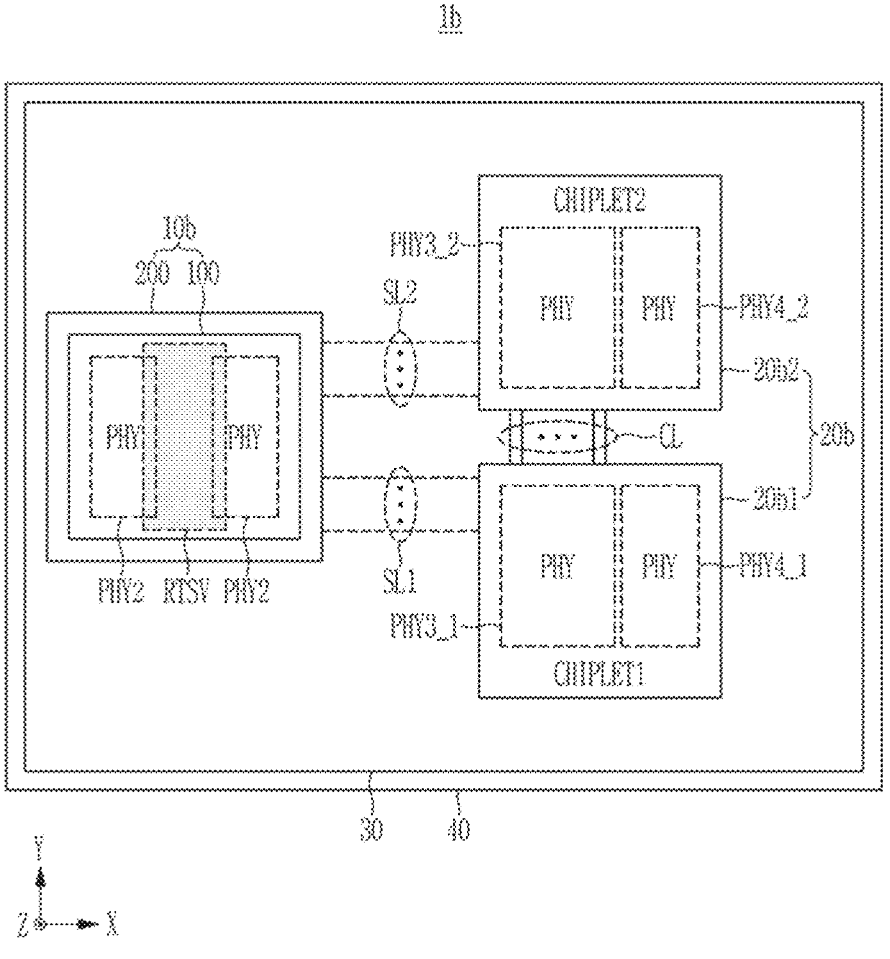
FIG. 9 and FIG. 10 are views illustrating a memory system according to an embodiment of the present inventive concept.
Figure 10:
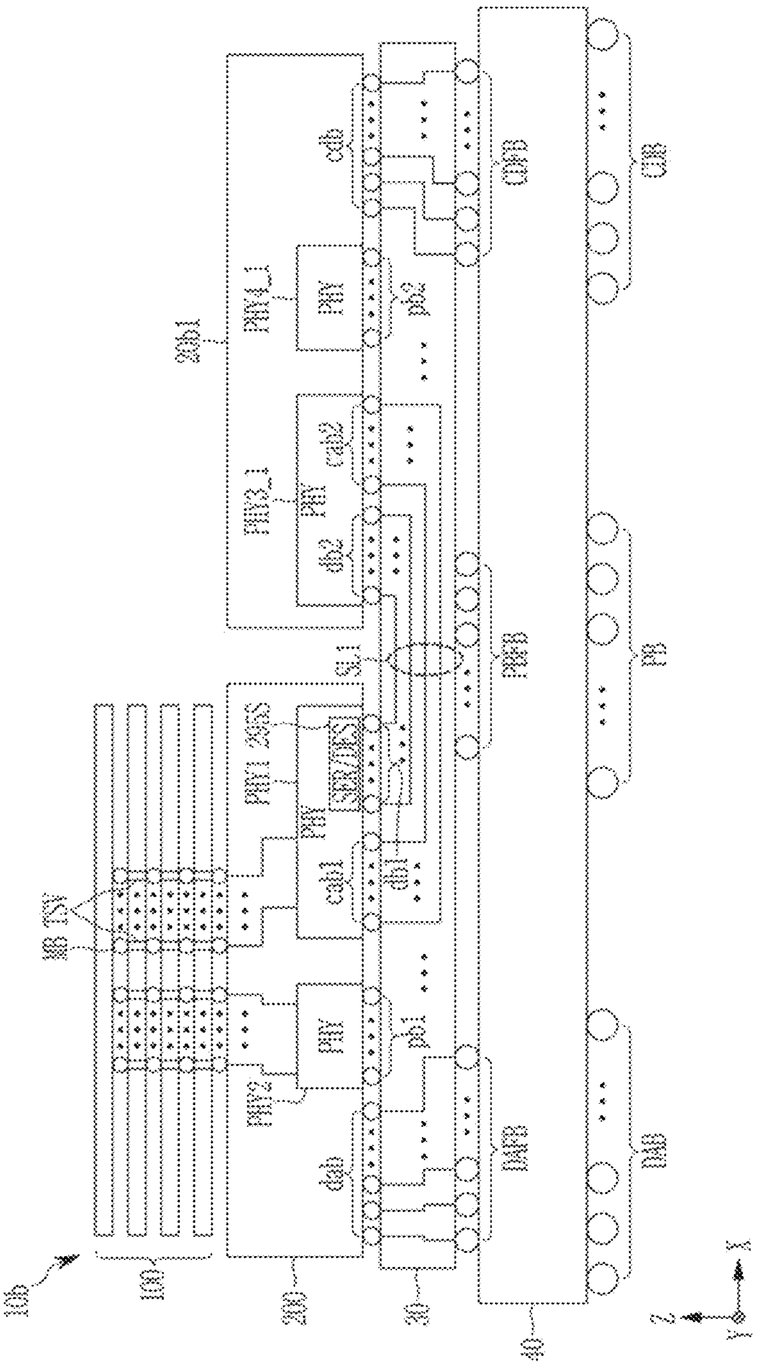

FIG. 9 and FIG. 10 are views illustrating a memory system according to an embodiment of the present inventive concept. A memory system 1*b*, a memory device 10*b*, and a host device 20*b* in FIG. 9 and FIG. 10 may correspond to the memory system 1*a*, the memory device 10*a*, and the host device 20*a* in FIG. 2 to FIG. 8.

The memory system 1*b* in FIG. 9 and FIG. 10 may be described in comparison with the memory system 1*a* in FIG. 2 to FIG. 8, and will be described with a focus on the differences for ease of explanation. A description of components of the memory system 1*b* that are not to be described may be replaced by the description of corresponding components in the memory system 1*a* in FIG. 2 to FIG. 8. In other words, redundant descriptions may be omitted hereinafter.

Referring to FIG. 1, FIG. 2, FIG. 9, and FIG. 10, the host device 20*b* of the memory system 1*b* may include a first host device 20*b*1 and a second host device 20*b*2. In embodiments of the present inventive concept, the first host device 20*b*1 and the second host device 20*b*2 may be chiplets which are in the form of dies that are separated from each other.

In embodiments of the present inventive concept, the first host device 20*b*1 and the second host device 20*b*2 may be mounted on the interposer 30. In embodiments of the present inventive concept, the first host device 20*b*1 and the second host device 20*b*2 may be disposed so as not to overlap each other in the third direction Z.

The first host device 20*b*1 may include a 3_1-st physical layer PHY3_1 and a 4_1-st physical layer PHY4_1. In embodiments of the present inventive concept, in the first host device 20*b*1, the 3_1-st physical layer PHY3_1 and the 4_1-st physical layer PHY4_1 may be of different types from each other and be disposed separately.

The 3_1-st physical layer PHY3_1 may correspond to the first physical layer PHY1. The first host device 20*b*1 may transmit a clock signal CLK, commands CMD, and addresses ADDR to the memory device 10*b* through the 3_1-st physical layer PHY3_1 and first signal lines SL1, which are some of the signal lines SL, and may transmit and receive data signals DQ to and from the memory device 10*b*.

In embodiments of the present inventive concept, the 3_1-st physical layer PHY3_1 may be a UCIe PHY. The 3_1-st physical layer PHY3_1 may comply with requirements presented in the UCIe which is an open standard. The presented requirements may be the requirements described as an example in association with the first physical layer PHY1.

The 4_1-st physical layer PHY4_1 may correspond to the second physical layer PHY2, and the first host device 20*b*1 may provide a power signal PWR that is generated by the power management integrated circuit 20PM to the memory device 10*b* through the 4_1-st physical layer PHY4_1 and a power line PL.

In embodiments of the present inventive concept, the 4_1-st physical layer PHY4_1 may be one of HBM 2E/2 PHYs and HBM3 PHYs complying with JEDEC HBM, or may be one of HBI PHYs, DDR5/4 PHYs, and USR/XSR PHYs, but the present inventive concept is not limited thereto.

The second host device 20*b*2 may include a 3_2-nd physical layer PHY3_2 and a 4_2-nd physical layer PHY4_2. In embodiments of the present inventive concept, in the second host device 20*b*2, the 3_2-nd physical layer PHY3_2 and the 4_2-nd physical layer PHY4_2 may be of different types from each other and be disposed separately.

The 3_2-nd physical layer PHY3_2 may correspond to the first physical layer PHY1. The second host device 20*b*2 may transmit a clock signal CLK, commands CMD, and addresses ADDR to the memory device 10*b* through the 3_2-nd physical layer PHY3_2 and second signal lines SL2, which are some of the signal lines SL, and may transmit and receive data signals DQ to and from the memory device 10*b*.

In embodiments of the present inventive concept, the 3_2-nd physical layer PHY3_2 may be a UCIe PHY. The 3_2-nd physical layer PHY3_2 may comply with requirements presented in the UCIe which is an open standard. The presented requirements may be the requirements described as an example in association with the first physical layer PHY1.

The 4_2-nd physical layer PHY4_2 may correspond to the second physical layer PHY2, and the second host device 20*b*2 may provide a power signal PWR that is generated by the power management integrated circuit 20PM to the memory device 10*b* through the 4_2-nd physical layer PHY4_2 and a power line PL.

In embodiments, the 4_2-nd physical layer PHY4_2 may be one of HBM 2E/2 PHYs and HBM3 PHYs complying with JEDEC HBM, or may be one of HBI PHYs, DDR5/4 PHYs, and USR/XSR PHYs, but the present inventive concept is not limited thereto.

In embodiments of the present inventive concept, the 3_1-st physical layer PHY3_1 and the 3_2-nd physical layer PHY3_2 may be coupled to each other through conductive lines CL that are disposed in the interposer 30, and the first host device 20*b*1 and the second host device 20*b*2 may transmit and receive data signals DQ through the 3_1-st and 3_2-nd physical layers PHY3_1 and PHY3_2 and the conductive lines CL.

Figure 11:
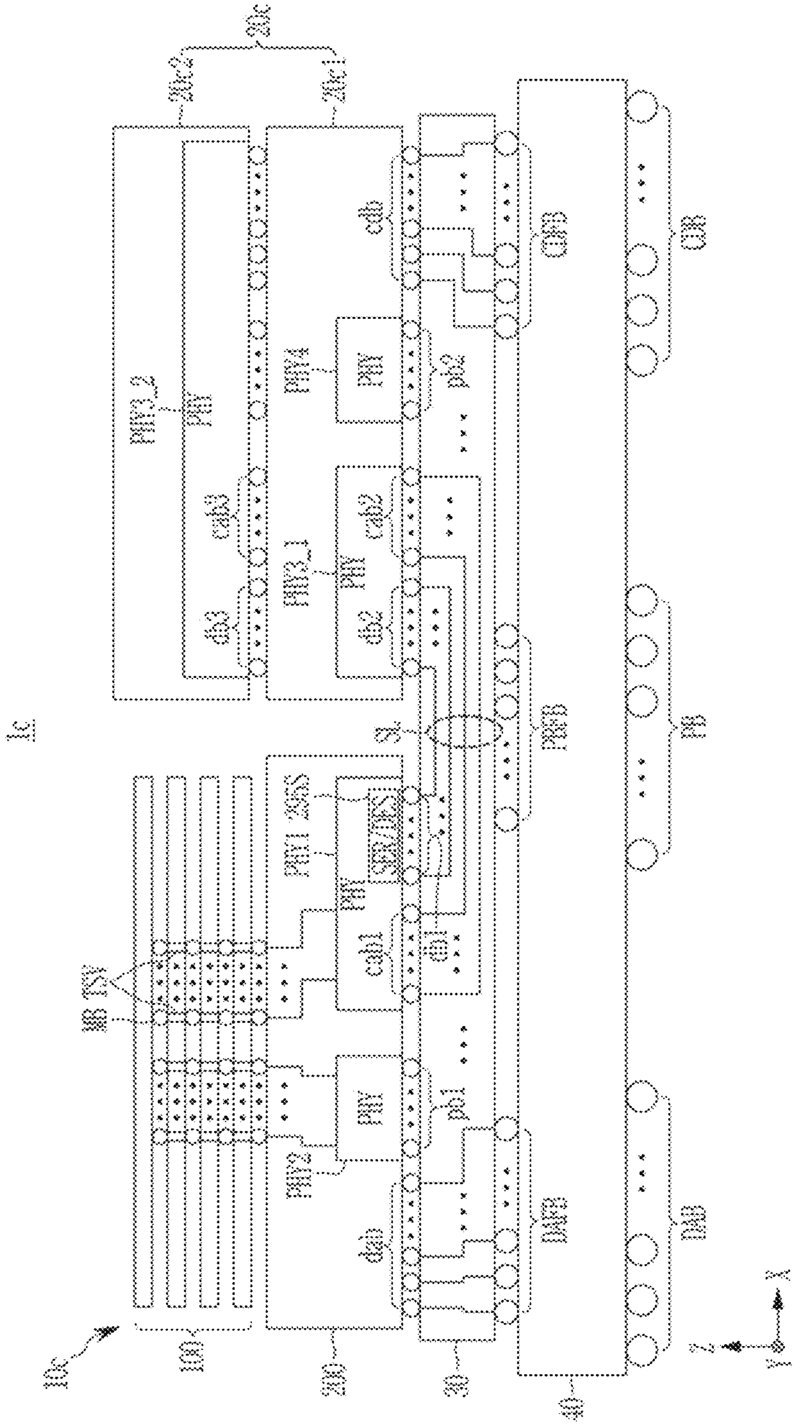
FIG. 11 is a view illustrating a memory system according to an embodiment of the present inventive concept.

FIG. 11 is a view illustrating a memory system according to an embodiment of the present inventive concept. A memory system 1*c*, a memory device 10*c*, and a first host device 20*c*1 in FIG. 11 may correspond to the memory system 1*a*, the memory device 10*a*, and the host device 20*a* in FIG. 2 to FIG. 8.

The memory system 1*c* in FIG. 11 may be described in comparison with the memory system 1*a* in FIG. 2 to FIG. 8, and will be described with a focus on the differences for ease of explanation. A description of components of the memory system 1*c* that are not to be described may be replaced by the description of corresponding components in the memory system 1*a* in FIG. 2 to FIG. 8. In other words, redundant descriptions may be omitted hereinafter.

Referring to FIG. 1, FIG. 2, and FIG. 11, a host device 20*c* of the memory system 1*c* may further include a second host device 20*c*2. In embodiments of the present inventive concept, the first host device 20*cl* and the second host device 20*c*2 may be chiplets which are in the form of dies that are separated from each other.

In embodiments of the present inventive concept, the first host device 20*cl* may be mounted and disposed on the interposer 30, and the second host device 20*c*2 may be disposed on the first host device 20*cl*. In embodiments of the present inventive concept, the first host device 20*cl* and the second host device 20*c*2 may overlap each other in the third direction Z.

The second host device 20*c*2 may include a 3_2-nd physical layer PHY3_2.

The 3_2-nd physical layer PHY3_2 may correspond to the first physical layer PHY1. The second host device 20*c*2 may be coupled to the first host device 20*cl* through the 3_2-nd physical layer PHY3_2 and bumps that are disposed below the second host device 20*c*2, such as a plurality of third command and address bumps cab3 and a plurality of third data bumps db3.

The second host device 20*c*2 may transmit and receive the clock signal CLK, commands CMD, addresses ADDR, and data signals DQ to and from the first host device 20*c*1, and may receive a power signal PWR.

In embodiments of the present inventive concept, the 3_2-nd physical layer PHY3_2 may be a UCIe PHY. The 3_2-nd physical layer PHY3_2 may comply with requirements presented in the UCIe which is an open standard. The presented requirements may be the requirements described as an example in association with the first physical layer PHY1.

Figure 12:
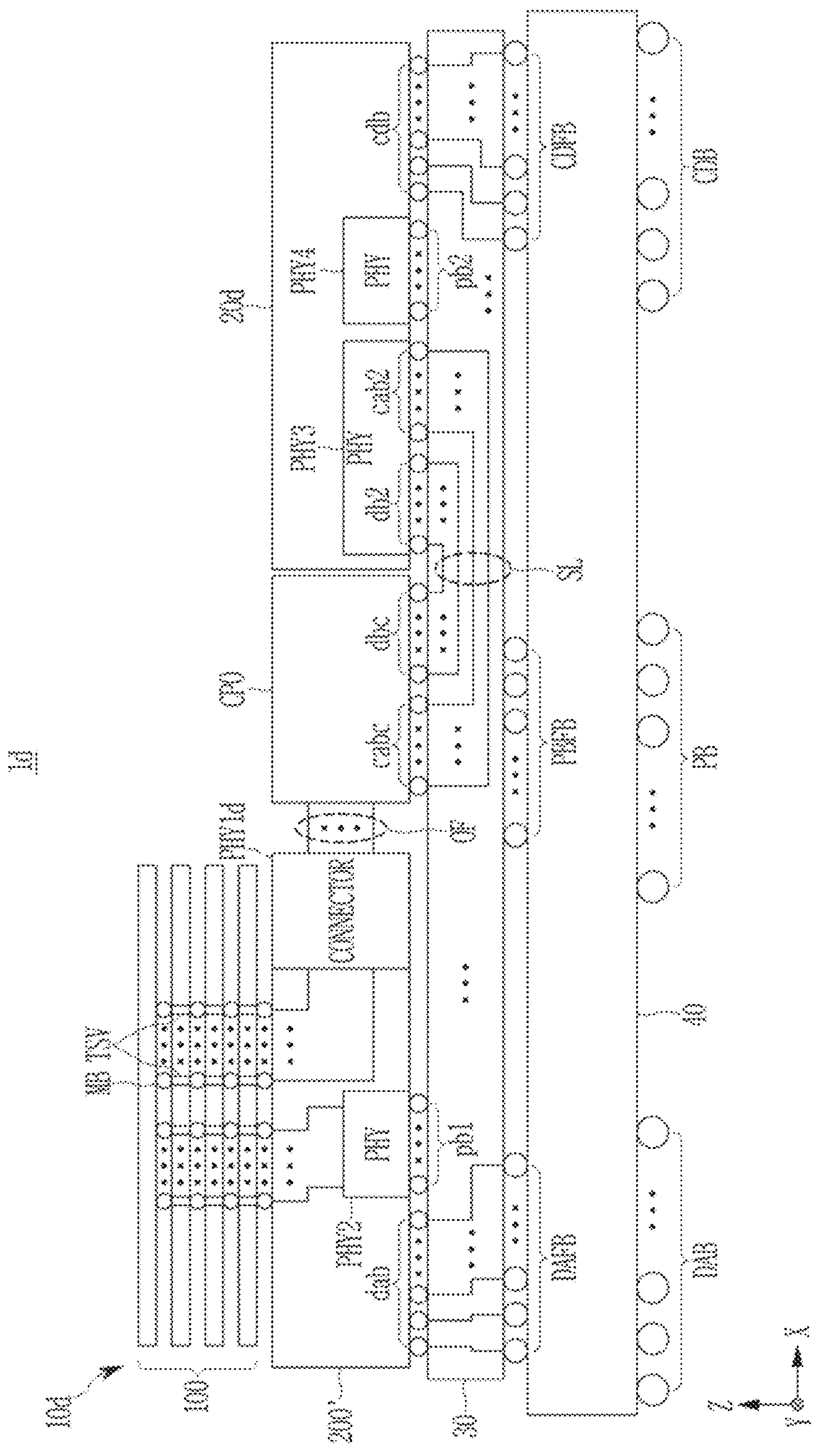
FIG. 12 is a view illustrating a memory system according to an embodiment of the present inventive concept.

FIG. 12 is a view illustrating a memory system according to an embodiment of the present inventive concept. A memory system 1*d*, a memory device 10*d*, and a host device 20*d* in FIG. 12 may correspond to the memory system 1*a*, the memory device 10*a*, and the host device 20*a* in FIG. 2 to FIG. 8.

The memory system 1*d* in FIG. 12 may be described in comparison with the memory system 1*a* in FIG. 2 to FIG. 8, and will be described with a focus on the differences for ease of explanation. A description of components of the memory system 1*d* that are not to be described may be replaced by the description of corresponding components in the memory system 1*a* in FIG. 2 to FIG. 8. In other words, redundant descriptions may be omitted hereinafter.

Referring to FIG. 1, FIG. 2, and FIG. 12, the memory system 1*d* may further include a co-packaged optics (CPO) device as compared to the memory system 1*a* in FIG. 2.

The co-packaged optics (CPO) device may be mounted on the interposer 30, and may be disposed between the memory device 10*d* and the host device 20*d* according to embodiments of the present inventive concept. The co-packaged optics (CPO) device, the memory device 10*d*, and the host device 20*d* may be disposed so as not to overlap one another in the third direction Z, but the present inventive concept is not limited thereto.

In embodiments of the present inventive concept, the co-packaged optics (CPO) device and the host device 20*d* may be coupled through the signal lines SL that are disposed in the interposer 30. The signal lines SL may couple a plurality of command and address bumps cabc and a plurality of data bumps dbc, which are disposed on the lower surface of the co-packaged optics (CPO) device in the third direction Z, to the plurality of second command and address bumps cab2 and the plurality of second data bumps db2, respectively, which are disposed on the lower surface of the host device 20*d*.

The co-packaged optics (CPO) device and the memory device 10*d* may be coupled to each other through optical fibers OF.

The co-packaged optics (CPO) device may include photoelectric conversion elements and electro-optic conversion elements. The photoelectric conversion elements may be photodiode elements, and the electro-optic conversion elements may be laser diode elements, but the present inventive concept is not limited thereto.

In embodiments of the present inventive concept, the co-packaged optics (CPO) device may convert electrical input signals into optical signals and transmit the optical signals to the optical fibers OF. In addition, the co-packaged optics (CPO) may convert optical signals, which are input through the optical fibers OF, into electrical signals.

In embodiments of the present inventive concept, a first physical layer PHY1*d* of a buffer die 200' may include an optical connector CONNECTOR, and the optical connector CONNECTOR may be coupled to the optical fibers OF. The optical connector CONNECTOR may include photoelectric conversion elements and electro-optic conversion elements, and may receive optical signals input from the optical fibers OF and convert them into electrical signals. Further, the optical connector CONNECTOR may serve as an optical driver to convert electrical signals of the memory device 10*d* into optical signals and provide optical signals to the optical fibers OF.

Figure 13:
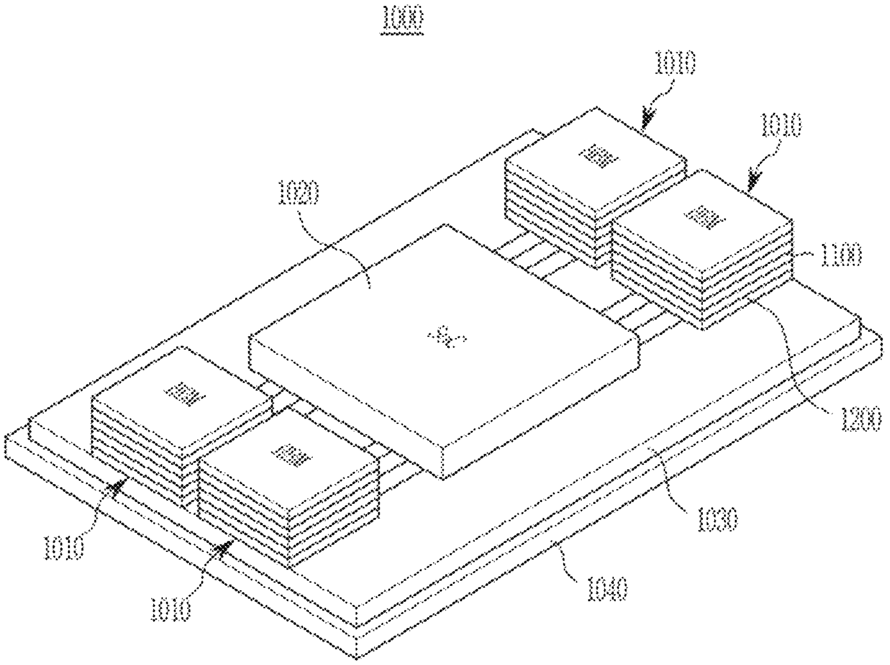
FIG. 13 is a perspective view illustrating the configuration of a system device adopting a memory system according to an embodiment of the present inventive concept.

FIG. 13 is a perspective view illustrating the configuration of a system device adopting a memory system according to an embodiment of the present inventive concept.

Referring to FIG. 13, a system device 1000 may be a memory module including at least one memory device 1010 and a system-on-chip (SOC) 1020 that are mounted on a package substrate 1040 such as a printed circuit board, as a semiconductor package. An interposer 1030 may be optionally provided on the package substrate 1040.

The memory device 1010 may be formed in the form of a chip-on-chip (CoC). The memory device 1010 may include a memory die 1100 including at least one core die stacked on a buffer die 1200. The memory die 1100 and the buffer die 1200 may be coupled to each other through through-silicon vias (TSVs).

The buffer die 1200 may include a first physical layer and a second physical layer. The first physical layer converts data signals input to the memory die 1100 into data and exchanges data signals with the system-on-chip 1020, and the second physical layer receives power signals for driving the memory device 1010.

The first physical layer and the second physical layer may be different types from each other, and may be separately disposed, according to embodiments of the present inventive concept. The buffer die 1200 may include the first physical layer and the second physical layer, which is capable of receiving power for driving the memory device 1010 without a separate charge pump while performing communication with the system-on-chip 1020.

The buffer die 1200 may control the operations of the first physical layer and the second physical layer, thereby performing a serializing and deserializing operation on data signals input or to be output to the system-on-chip 1020. The buffer die 1200 may include the first physical layer and the second physical layer, and the embodiments described with reference to FIG. 1 to FIG. 12 may be applied thereto.

The memory device 1010 may be, for example, a high bandwidth memory (HBM) of about 500 GB/sec to about 1 TB/sec, or more.

While the present inventive concept has been shown and described with reference to the embodiments thereof, it will be apparent to those of ordinary skill in the art that various changes in form and detail may be made thereto without departing from the spirit and scope of the present inventive concept.

What is claimed is:

1. A memory device comprising:

first and second core dies that include a plurality of memory cells and are stacked in a first direction; and a buffer die that is stacked with the first and second core dies in the first direction and includes a first physical layer and a second physical layer, wherein the buffer die is configured to output data of the plurality of memory cells through the first physical layer, wherein the data of the plurality of memory cells is provided from the first and second core dies through through-vias that pass through the first and second core dies in the first direction, and wherein the second physical layer is separated from the first physical layer and is configured to receive power signals from outside.

2. The memory device of claim 1, wherein the first physical layer is a universal chiplet interconnect express (UCIe) physical layer.

3. The memory device of claim 2, wherein the buffer die is disposed on an interposer, and the first physical layer is configured to output data signals to the interposer on the basis of the data of the plurality of memory cells.

4. The memory device of claim 1, wherein the buffer die further includes a data input/output (I/O) buffer configured to output data signals based on the data of the plurality of memory cells, and the data I/O buffer is configured to output the data signals on the basis of an I/O voltage that is divided by a power voltage that is received from the second physical layer.

5. The memory device of claim 4, wherein the buffer die is configured to output the data signals, which are generated on the basis of the I/O voltage, through the first physical layer.

6. The memory device of claim 5, wherein a same ground voltage is applied to the buffer die and the first and second core dies, the range of the I/O voltage is from 0.2 V to 0.6 V, and the range of a drive voltage for the first and second core dies is from 1.0 V to 1.4 V.

7. The memory device of claim 6, wherein
the buffer die further includes a voltage divider circuit configured to generate the I/O voltage by dividing the power voltage.

8. The memory device of claim 1, wherein
the second physical layer is one of high-bandwidth memory (HBM) 2E/2 physical layers or HBM 3 physical layers.

9. The memory device of claim 8, wherein
the buffer die further includes an I/O gating circuit configured to latch the data of the plurality of memory cells, and
the I/O gating circuit is configured to receive a power voltage through the second physical layer.

10. The memory device of claim 1, wherein
the first and second core dies include row decoders configured to drive word lines that are coupled to the plurality of memory cells, and
the row decoders are configured to receive a boosting voltage through the second physical layer.

11. The memory device of claim 10, wherein
the second physical layer is coupled to the through-vias, and
the row decoder is configured to receive the boosting voltage through the second physical layer and the through-vias.

12. The memory device of claim 1, wherein
the upper surface of the buffer die includes a TSV region, wherein the through-vias are disposed on the TSV region, and
the TSV region is disposed between the first physical layer and the second physical layer.

13. The memory device of claim 1, wherein
the first physical layer includes an optical connector, and
the data of the plurality of memory cells are output in the form of optical signals through optical fibers that are coupled to the optical connector.

14. A memory system comprising:
a host device configured to output data signals;
an interposer that is coupled to the host device and includes signal lines in which the data signals are transferred; and
a memory device that includes a first physical layer and a second physical layer, wherein the first physical layer is configured to receive the data signals through the signal lines and the interposer, and the second physical layer is different from the first physical layer and is configured to receive a power signal from the interposer.

15. The memory system of claim 14, wherein
the host device includes a first host device and a second host device that are separated from each other,
the first host device is configured to output the data signals and includes a third physical layer which is a universal chiplet interconnect express (UCIe) physical layer, and
the second host device is configured to output the data signals and includes a fourth physical layer which is a UCIe physical layer.

16. The memory system of claim 15, wherein
the first physical layer is a UCIe physical layer, and
the third and fourth physical layers each of which is configured to output the data signals to the first physical layer through the interposer.

17. The memory system of claim 16, wherein
the first and second host devices do not vertically overlap each other on the interposer.

18. The memory system of claim 15, wherein
the first and second host devices vertically overlap each other.

19. The memory system of claim 18, wherein
the second host device is disposed on the first host device,
the second host device is configured to transmit the data signals to the first host device on the basis of the UCIe, and
the first host device is configured to transmit the data signals to the memory device on the basis of UCIe.

20. A memory system comprising:
a memory device that includes a first physical layer and a second physical layer, wherein the first physical layer is configured to output data signals and is a UCIe physical layer, and the second physical layer is separated from the first physical layer and is configured to receive a power signal; and
a host device that includes a third physical layer and a fourth physical layer, wherein the third physical layer is configured to receive the data signals that are output through the first physical layer, and the fourth physical layer is separated from the third physical layer and is configured to provide the power signal to the memory device through the second physical layer.

* * * * *